(12) United States Patent
Mann et al.

(10) Patent No.: US 6,768,149 B1
(45) Date of Patent: Jul. 27, 2004

(54) TAPERED THRESHOLD RESET FET FOR CMOS IMAGERS

(75) Inventors: Richard A. Mann, Torrance, CA (US); Lester J. Kozlowski, Simi Valley, CA (US)

(73) Assignee: ESS Technology, Inc., Fremont, CA (US)

( * ) Notice: Subject to any disclaimer, the term of this patent is extended or adjusted under 35 U.S.C. 154(b) by 0 days.

(21) Appl. No.: 09/680,036

(22) Filed: Oct. 5, 2000

(51) Int. Cl.[7] .................. H01L 31/062; H01L 21/00
(52) U.S. Cl. .................. 257/292; 257/291; 257/293; 257/294; 438/48; 438/60; 438/69; 250/208.1; 250/214.1
(58) Field of Search .................. 257/291–294, 257/233, 461, 407; 438/48, 60, 69, 66, 75; 250/208.1, 214.1, 208.2; 289/244, 344, 404, 325, 408, 391

(56) References Cited

U.S. PATENT DOCUMENTS

| | | | | |
|---|---|---|---|---|
| 4,841,346 A | * | 6/1989 | Noguchi .................. 357/23.1 |
| 5,904,493 A | * | 5/1999 | Lee et al. .................. 257/292 |
| 5,942,775 A | * | 8/1999 | Yiannoulos .................. 257/292 |
| 5,977,591 A | * | 11/1999 | Fratin et al. .................. 257/344 |
| 6,339,248 B1 | * | 1/2002 | Zhao et al. .................. 257/461 |
| 6,388,243 B1 | * | 5/2002 | Berezin et al. .................. 250/208.1 |
| 6,448,595 B1 | * | 9/2002 | Hsieh et al. .................. 257/292 |

* cited by examiner

Primary Examiner—Donghee Kang
(74) Attorney, Agent, or Firm—Farjami & Farjami LLP

(57) ABSTRACT

A sensor may be formed with a transistor comprising a gate that has both n-type and p-type regions to increase the gate work function. In combination with moving the p-type well such that the p-type well only partially dopes the channel of the transistor, the increased gate work function further increases the reset voltage level required to create the reset channel without having to use high doping levels in the critical regions of the sensor structure including the photo-detector and the reset transistor. The source of the reset transistor is partially beneath the n-type region of gate, while the transistor's drain is partially beneath the p-type region of the gate. The channel has a p-type well portion and a substrate portion. This construction of the sensor may eliminate the reset noise associated with the uncertainty of whether the charge left in the transistor's channel will flow back towards the photo-detector after the transistor has been turned off.

28 Claims, 7 Drawing Sheets

TAPERED THRESHOLD RESET FET FOR CMOS IMAGERS

BACKGROUND OF THE INVENTION

1. Technical Field

This invention relates to electronic imaging devices and, in particular, to imagers having FET reset switches.

2. Related Art

Conventionally, CMOS imagers contain a number of photodiodes that are continuously queried and reset. The resetting of the photodiodes attempts to place each of the photodiodes into a known state (i.e. an expected voltage or charge level) and is commonly controlled by a N-channel Metal Oxide Semiconductor (NMOS) Field Effect Transistor (FET) acting as a reset switch. The NMOS FET has a drain implant that is in direct contact with a lighter doped P-well and protrudes into the material under the gate region of the NMOS FET.

The utilization of NMOS FETs acting as reset switches in CMOS imagers results in an additional source of noise, commonly known as reset noise (known as kTC noise). The typical construction of a NMOS FET allows charge to flow back to the drain and contributes to the reset noise in a CMOS imager. The length of time between resets and temperature changes affects the rate at which charge in a NMOS FET flows back to the drain and increases the reset noise when voltage is removed from the gate. The problem created by reset noise in a CMOS imager is that it causes uncertainty bout the voltage values at the photodiodes after a reset. Attempts to compensate for reset noise in a NMOS FET have been generally unsuccessful due to charge redistribution that depends on the localized substrate noise (i.e. correlated double sampling measurements of the reset noise during a read operation). In addition, for signal readout circuits configured to integrate the photogenerated signal on the total sense capacitance, such as the source follower arrangement of Fry, et al., (IEEE JSSC, Vol. SC-5, No. 5, October 1970), is affected by the increased capacitance. The increased capacitance of a conventional reset FET decreases the electrical gain of the signal readout circuits. The decreased electrical gain results from the sense capacitance being the aggregate of the detector capacitance and various stray capacitances in compact pixel designs. The stray capacitances include, for example, the gate capacitance of the transistor gate driven by the photodiode cathode and the associated capacitance of the reset transistor. Therefore, the increased capacitance of a conventional NMOS FET reset switch results in optical degraded sensitivity for the CMOS imager due to both higher reset noise and lower electro-optical sensitivity. Thus, the use of known types of compensation for reset noise still results in a loss of sensitivity in the CMOS imager.

Additional reset noise problems occur due to the single chip construction of a conventional NMOS FET utilized as a reset switch in a CMOS imager. Construction of conventional NMOS FET utilize fabrication methods using sub-micron technology. As a result, the NMOS FET is susceptible to junction leakage. It is not uncommon for high leakage to occur from the increased electric field associated with a shallow junction, Arsenic implant damage, gate induced drain leakage, or a combination of all of the previous. The junction leakage of a conventional NMOS FET results in poor optimization and continuous soft resets during low light operation of a CMOS imager. Soft resets generate image lag because the charge that is not fully cleared from the photo-detector is subsequently added to the signal in the next integration period. The poor optimization and continuous soft resets significantly contributes to the reset noise and loss of sensitivity at low light level problems in a CMOS imager. Therefore, there is a need for a device and method to increase sensitivity at low light level while reducing the reset noise in CMOS imagers regardless of temperature and periods between resets of photodiodes while reducing junction leakage of the NMOS FET.

SUMMARY

The tapered threshold reset FET for a CMOS imager has a sensor having a transistor with a gate located partially over a source and partially over a drain having material between the source and drain beneath the gate of a predetermined length. The sensor also has a detection device that may be coupled to the drain by a signal path, where the material allows the detection device to be reset to a predetermined state.

Broadly conceptualized, the sensor may be formed with a reset transistor that reduces the capacitance of the photodiode. This may be accomplished by moving the p-type well, that isolates the source from the drain such that the p-type well partially dopes the channel of the transistor. The transistor may also be constructed to reduce reset noise through the use of the tapered reset operation. The tapered reset operation may include a reset transistor of relatively high impedance capable of suppressing the basic reset noise associated with the photodiode capacitance via an on-chip circuit and by using a channel implant that increases the reset voltage level for creating the reset channel.

Other systems, methods, features and advantages of the invention will be or will become apparent to one with skill in the art upon examination of the following figures and detailed description. It is intended that all such additional systems, methods features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principals of the invention. In the figures, like reference numerals designate corresponding parts throughout the different views.

DETAILED DESCRIPTION OF THE PREFERRED EMBODIMENTS

Figure 1:
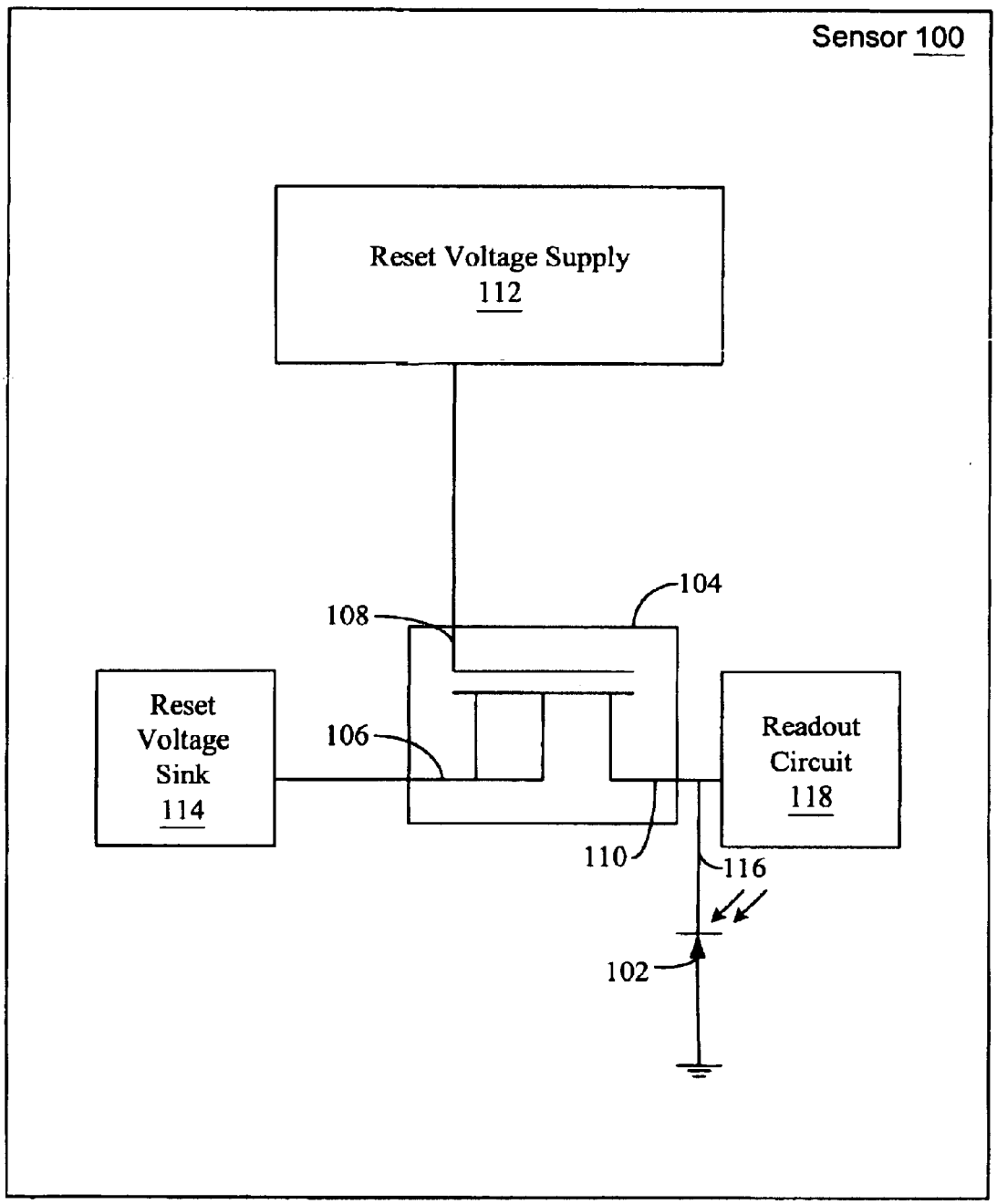
FIG. 1 is a schematic diagram depicting an exemplary implementation of a sensor having a photo-detector and a reset switch in accordance with the invention.

In FIG. 1, a schematic diagram depicting a sensor 100 having a photo-detector 102 and a transistor 104 acting as a reset switch is shown. The sensor 100 includes a photo-detector 102 having of a p-n junction and the transistor 104 acting as a reset switch. The transistor has a source 106, a gate 108, and a drain 110. The gate 108 of transistor 104 is electrically connected to a reset voltage supply 112. The source 106 of transistor 104 is electrically connected to a reset voltage sink 114, preferably ground. The drain 110 of transistor 104 is electrically connected to the anode 116 of the photo-detector 102 and a readout circuit 118. The readout circuit 118 samples and processes the output of the photo-detector 102 during a read operation of the sensor 100. However, one skilled in the art appreciates, that in an alternate embodiment the photo-detector may selectively be electrically associated with the source 106 as opposed to the drain 110 to facilitate a reset of the photo-detector 102.

Upon a reset voltage being applied to the gate 108 of transistor 104 (acting as a reset switch) via the reset voltage supply 112, a positive charge on the photo-detector 102 passes from the drain 110 to the source 106 of transistor 104 and ultimately to the reset voltage sink 114. Once the reset operation is complete and the transistor 104 is turned off (i.e. the voltage on the gate 108 is removed), the remaining charge on the photo-detector 102 is measured and stored in memory (not shown) via readout circuit 118. The stored charge value is utilized for correlated double sampling (CDS) in order to reduce reset noise via post processing and is a measure of offset error including the offset associated with the readout circuit 118 amplification, the random offsets generated by charge redistribution, and the classical reset noise. The offset error is described by the expression:

$$\text{reset noise (carriers)} = \frac{\sqrt{kTC_{sense}}}{e}$$

where "k" is Boltzman's constant, "T" is the temperature, "$C_{sense}$" is the sense capacitance and "e" is the electron charge. In FIG. 1, $C_{sense}$ is comprised of the capacitance of photodiode 102, the input capacitance of the readout circuit 118, and the stray capacitance associated with the transistor 104 acting as a reset switch. Minimizing the capacitances reduces the maximum reset noise in sensor 100 with out utilizing the additional hardware and costs associated with CDS.

Radiation or light is then permitted to accumulate on the photo-detector 102 for a predefined time (i.e. integration period), before the charge is read again via the readout circuit 118. Ideally, the error in this second read is corrected by compensating for the earlier measurement for offset and reset noise. The reset error, however, may be significant and vary depending on the length of time of the reset and the construction of transistor 104 utilized as the reset switch.

Figure 2:
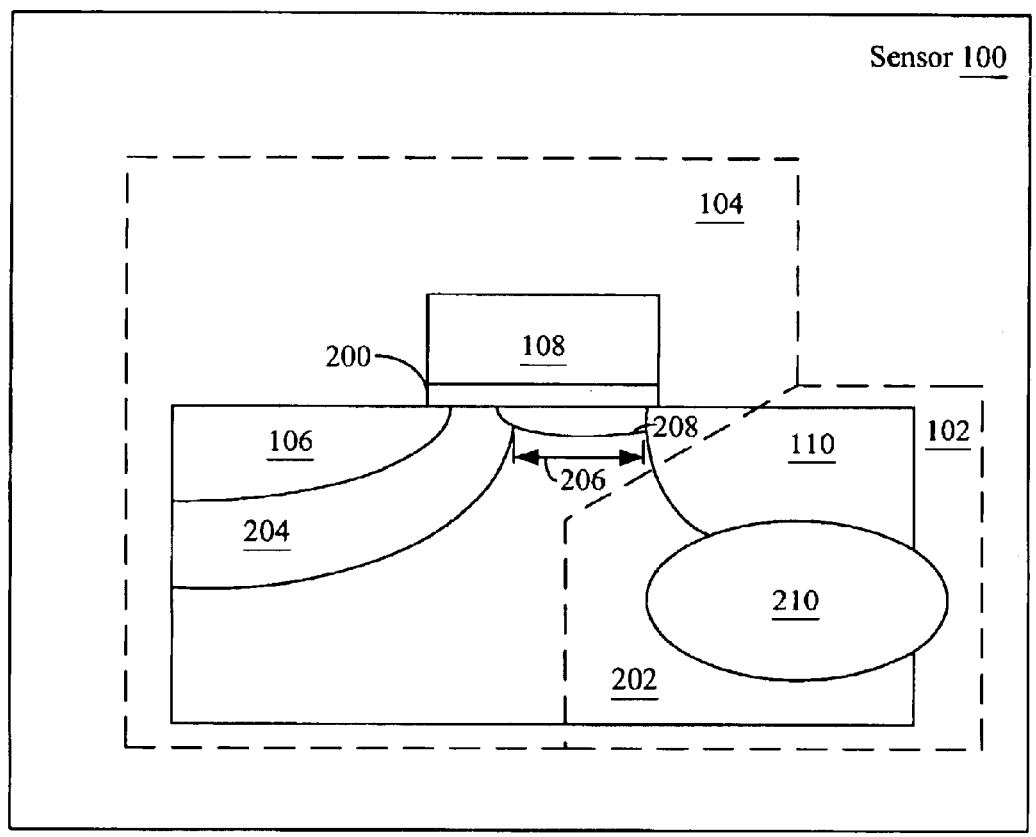
FIG. 2 is a cross sectional view illustrating the sensor of FIG. 1 having a FET transistor reset switch.

FIG. 2 is an illustration of a cross sectional view of the sensor 100. The sensor 100 has a photo-detector 102, a FET transistor 104 reset switch. The transistor 104 has a gate 108 with a dielectric insulator 200, a source 106, and a drain 110 formed in a substrate 202. The source 106 is formed within a p-type well 204 (p-type atoms include Phosphorus, Arsenic, Nitrogen Antimony, and Bismuth) and is partially beneath the gate 108. The p-type well 204 is implanted or formed within the substrate 202. The source 106 is preferably formed as a shallow surface implant on the p-type well 204. The drain 110 is preferably formed with the substrate 202 to be partially beneath the gate 108. The drain 110 is electrically associated with a photo-detector 102 formed with the surface implant of the drain 110, deep implant 210, and substrate 202. Additionally, a person skilled in the art would recognize that the source 106 may selectively be interchanged with the drain 110 and associated with the photo-detector 102.

The transistor 104 of sensor 100 further includes a material in the space defined by the separation of the source 106 from the drain 110 beneath the gate 108. An example implementation of the transistor 104, the length 206 of the material is at least 20 percent longer than a process minimum. For example, the process minimum gate length for a conventional 3.3 volt logic process range is approximately 0.35 microns. The recommended minimum gate length to avoid exaggerated short channel effects would be approximately 0.4 microns. While increasing the length 206 by approximately 20 percent of the process minimum increases the potential required to deplete the reset channel. In one embodiment, the gate 108 may have a predetermined length that is approximately twice the process minimum (e.g., 0.35 microns) based on the material length 206. But, the increase in potential required to deplete the reset channel. But, the increase in potential required to deplete the reset channel significantly decreases the likelihood of a soft reset during a read operation (i.e. subthreshold leakage does not degrade low light operation) and promotes the proper functioning of the various forms of tapered reset. An additional result of increasing the length of the gate 108 is that the doping of the gate 108, source 106, drain 110, and associated channel may be decreased.

The channel has a well portion and a shallow implant 208. The implant 208 may be formed with a Boron dopant, but other implementations may selectively utilize hole-increasing dopants such as Aluminum, Gallium, Indium, and Thallium. The well portion of the channel constitutes a portion of the p-type well 204. The implant 208 is disposed between the channel well portion 204 of the source 106 and the drain 110. Additionally, one skilled in the art would appreciate, the channel implant 208 may be disposed between the channel well portion and the source 106 when the photo-detector 102 is formed to be operably associated with the source 106.

The implant 208 is preferably formed to be sufficiently shallow such that the concentration of dopant near the channel surface under the gate 108 further increases the potential that must be applied to the gate 108 in order to deplete the reset channel and the implant 208 dose may be reduced to below the dopant level of the channel well portion. In this instance, because the implant 208 has a lower dopant level than the channel well portion, the drain 110 dose may be advantageously reduced from $3e^{13}$ cm$^{-3}$ n-type, the typical level for a conventional NMOS FET, to approximately $6e^{12}$ cm$^{-3}$ n-type. This has the additional advantage of reducing the capacitance of the photo-detector 102 relative to its volume and lowering junction leakage associated with arsenic implant damage and gate 108.

Figure 3:
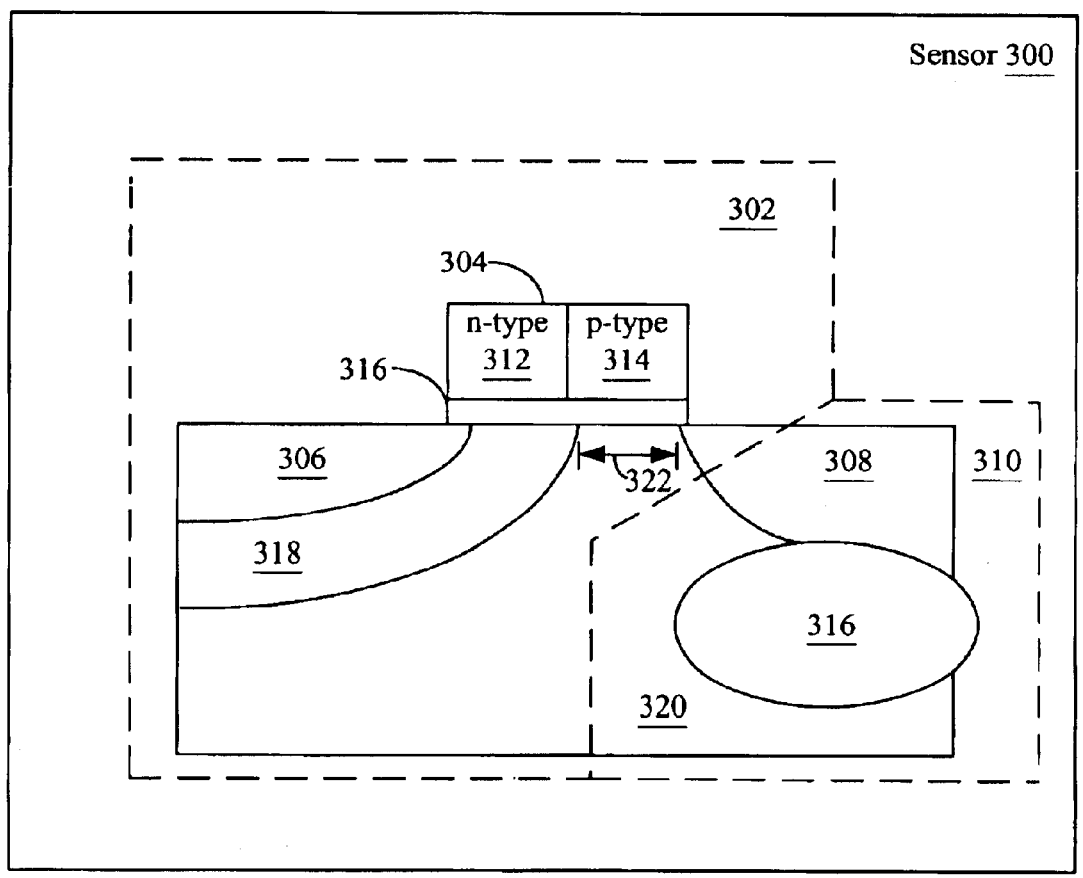
FIG. 3 is a cross sectional view illustrating another example of the sensor of FIG. 1 having a FET transistor reset switch.

In FIG. 3, a cross sectional view of an exemplary implementation of the sensor 300 of FIG. 1 is illustrated. The FET transistor 302 has a gate 304, a source 306, and a drain 308. The drain 308 of the transistor 302 is connected to the deep implant 316 of photo-detector 310. The gate 304 has a n-type region 312, a p-type region 314, and a dielectric insulator 316. The source 306 includes a p-type well 318 located in a substrate 320. In this implementation, material is located between the p-type well 318 of the source 306 and the drain 308. The length 322 of the material is defined by the separation of the source 306 from the drain 308 beneath the gate 304. The length 322 of the material is preferably at least 20 percent longer than the process minimum. As a result, the gate 108 may have a predetermined length that is approximately twice the process minimum.

As depicted in FIG. 3, the gate 304 has an n-type region 312, and a p-type region 314 that form gate 304. The gate 304 is preferably formed with polysilicon regions of opposite polarity (examples of polysilicons are; Boron, Aluminum, Gallium, Indium, Thallium, Nitrogen, Phosphorus, Arsenic, Antimony, and Bismuth). The potential that is applied to gate 304 in order to deplete the reset channel is increased (i.e. due to the resulting increase in the work function of the gate 304) without having to use high doping levels in the transistor 302.

The source 306 is formed with a p-type well 318, and partially beneath the n-type gate portion 312 of gate 304. The p-type well 318 is diffused into or formed with the substrate 320. The source 306 is preferably formed as a shallow surface implant on the type well 318.

The drain 308 is formed with the substrate 320 and partially beneath the p-type region 314 of the gate 304. The drain 308 is electrically associated with a photo-detector 310 that is formed by the deep implant 316 and the drain 308 in the substrate 320. The drain 308 is preferably formed as a shallow surface implant on the deep implant 316 and underlying substrate 320.

The material between the p-well 318 of the source 306 and drain 308 define a length 322 of a channel in the substrate 320. The well portion of the channel constitutes a portion of the p-type well 318 of the source 306. The channel substrate portion has a first conductivity type (e.g. n-type) while the p-well portion 318 has a second conductivity type (e.g. p-type). Therefore, because the swell portion 318 is disposed away from the drain 308 (i.e. away from the photo-detector 310 side of the transistor), the capacitance typically associated with the p-type well 318 and drain junction in a conventional NMOS FET is effectively removed (i.e. channel substrate portion has the same conductivity type as the drain 308) that substantially suppresses reset noise. In addition, the drain 308 dose may be reduced from $3e^{13}$ cm$^{-3}$ n-type, the typical level for a conventional NMOS FET, to approximately $2e^{12}$ cm$^{-3}$ n-type since there is no need to overcome the high p-type doping of the p-well 318.

Figure 4:
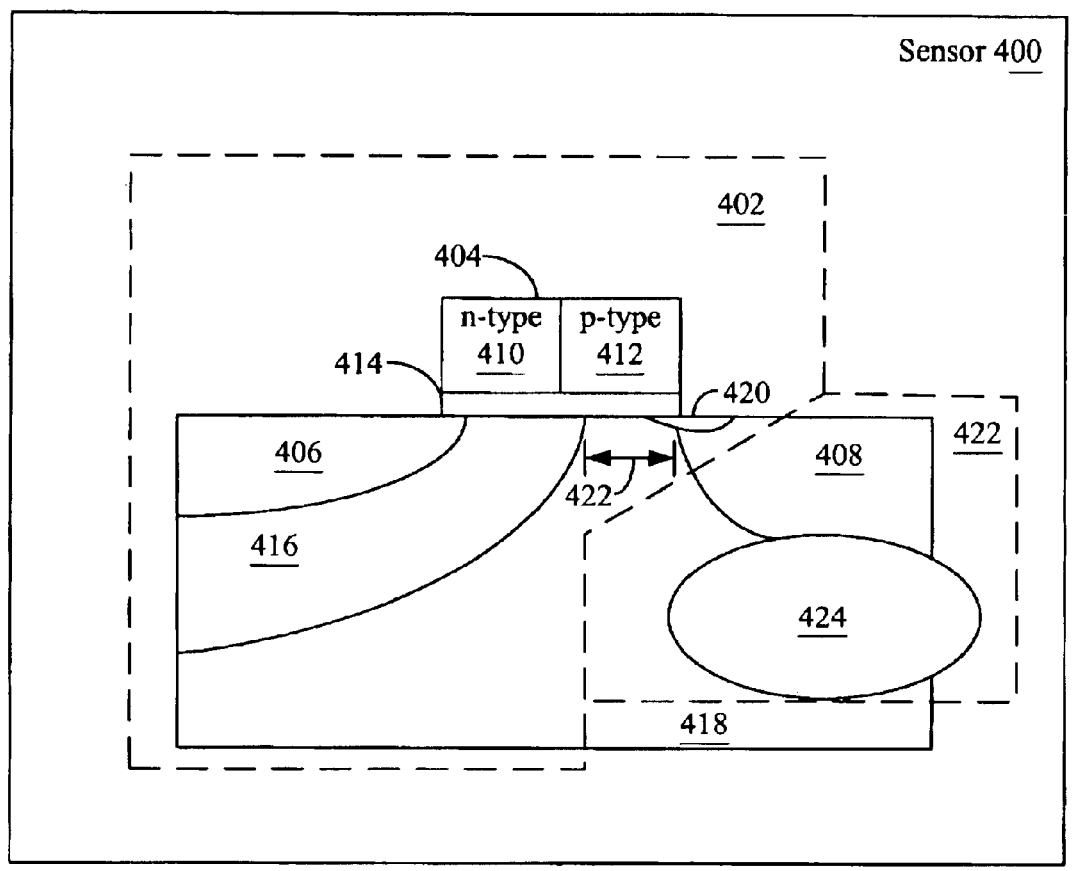
FIG. 4 is a cross sectional view illustrating still another exemplary implementation the sensor of FIG. 1 having a FET transistor.

In FIG. 4, a cross sectional view of still another example of an implementation of the sensor 400 having a FET transistor 402 is illustrated. The transistor 402 includes a gate 404, a source 406, a drain 408. The gate 404 has an n-type region 410 and a p-type region 412 overlying dielectric insulator 414. The source 406 includes a p-type well 416 formed in a substrate 418. The drain 408 of transistor 402, however, is formed with a p-type surface implant 420. The p-type surface implant 420 is formed in the drain 408 partially beneath the p-type region 412 of the gate 404, such that the drain 408 is not in direct contact with the surface of gate 404 (i.e., is in contact with the dielectric insulator 414 of the gate 404). The material under the dielectric insulator 414 has a length 422 defined by the separation of the p-type well 416 and drain 408 located beneath the gate 404.

Figure 5:
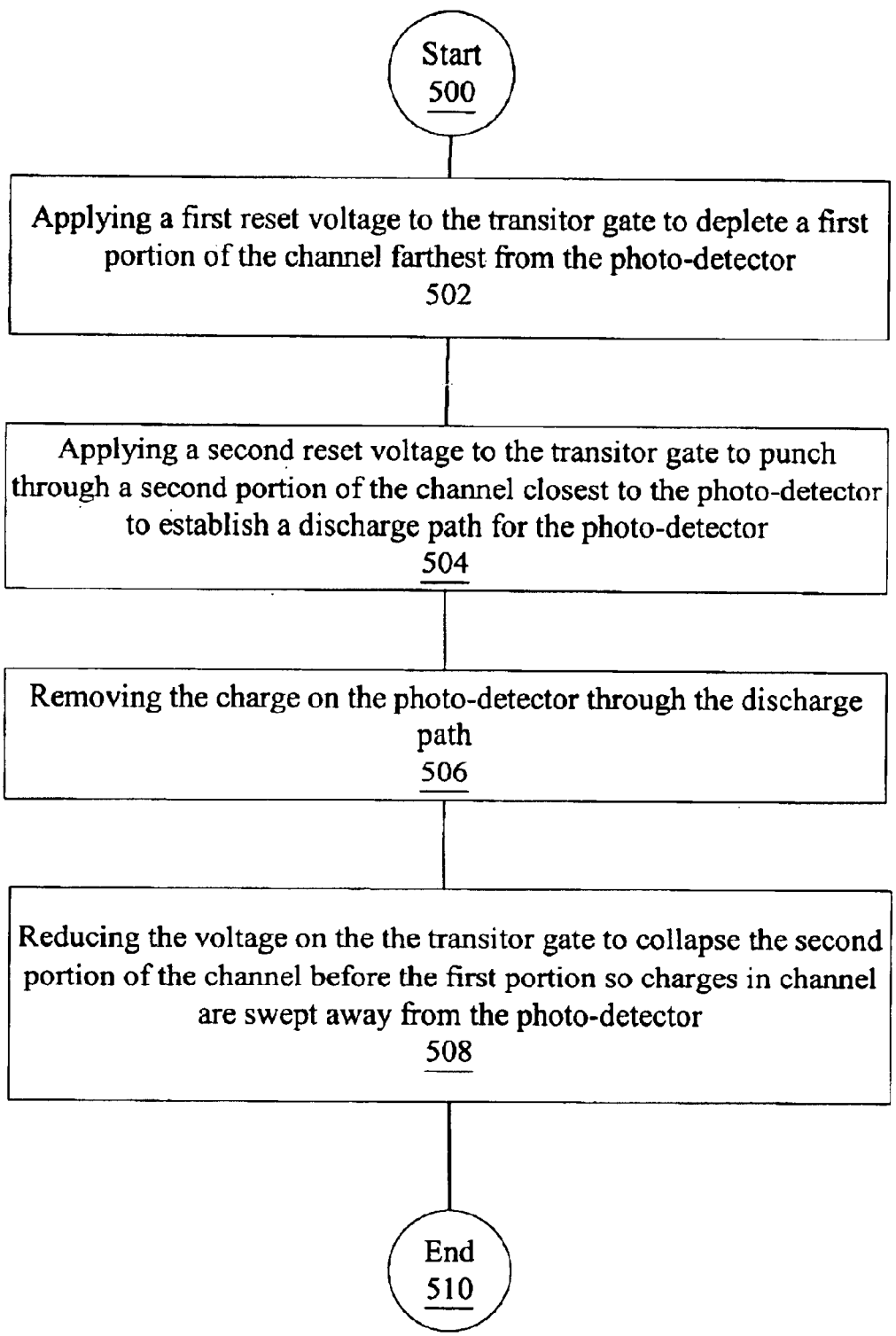
FIG. 5 is a flow diagram illustrating an example process for resetting the sensor of FIG. 4.

Turning to FIG. 5 is a flow diagram illustrating an example process for resetting the sensor 100 shown in FIG. 2. The process begins 500 when a potential is applied to the gate 108 (FIG. 2), resulting in the channel well portion being depleted 502 (FIG. 5). The drain 110 is not in direct contact with the surface channel of gate 108 due to the insulator 200. The gate 108 forces conduction (i.e. during a reset operation) away from the gate 108 edge nearest the drain 110. Therefore, substantially no conduction occurs through the channel substrate 418 until the potential on the source 106 and the depleted channel p-well portion 204 is sufficient to punch through to the drain 110.

Figure 6:
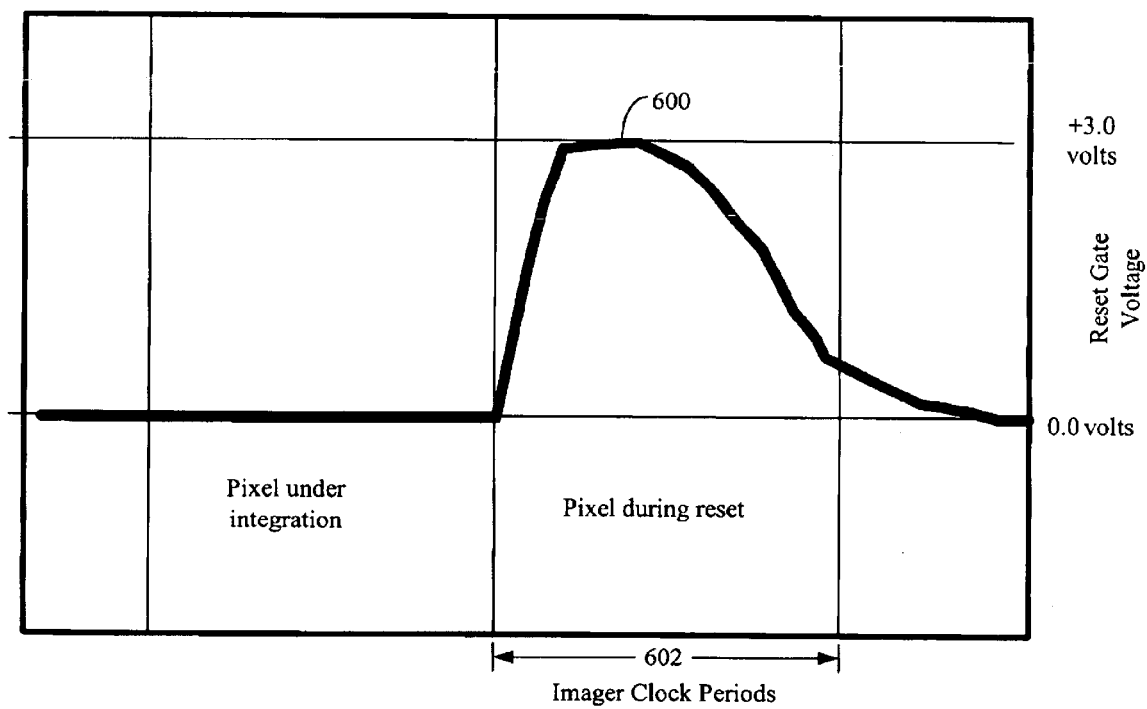
FIG. 6 is a signal diagram illustrating a tapered reset voltage applied to the FET of FIG. 4.

As the applied potential to the gate 108 and the channel well portion is increased during the tapered reset (See FIG. 6 for representative tapered reset voltage waveform). The depletion regions associated with the p-type well 204 of the source 106 and drain 110 merge below the implant 208 to accomplish the punch through of the channel 504 (FIG. 5). Once punch through occurs, carriers are swept through the merged depletion region 506 from the drain 110 to the p-type well 204 of the source 106. In other words, the potential or reset voltage applied to the gate 108 must be increased beyond the level required for the channel well portion to be depleted in order to punch through the substrate 202 portion. Once punch through is accomplished a electrical field is establish to release or diffuse the charge on the photo-detector through the created reset channel. The voltage applied to the gate 108 is reduced allowing the channel below the implant 208 to collapse starting at the drain 110 end of the channel before the source end. Thus, sweeping the charges away from the photo-detector 508. Because there are very few minority carriers in the fully depleted channel, there is reduced thermal noise associated with this charge transfer process. Processing is completed 510 and the photo-detector 102 discharged when the voltage is removed from gate 108.

In FIG. 6, a voltage plot is shown. The reset voltage 600 is applied and then tapered or lowered slowly, preferably over one clock cycle 602, to gradually maintain the potential difference between the channel ends (i.e. between source and drain) such that the charge on the photo-detector is sufficiently removed. As the reset voltage is tapered or lowered, the portion of the channel created by punching through the channel substrate portion is pinched off or collapses before the depleted portion of the reset channel (i.e. the channel well portion) causing charges remaining in the reset channel to be swept towards the source and away from the drain or photo-diode 102.

Figure 7:
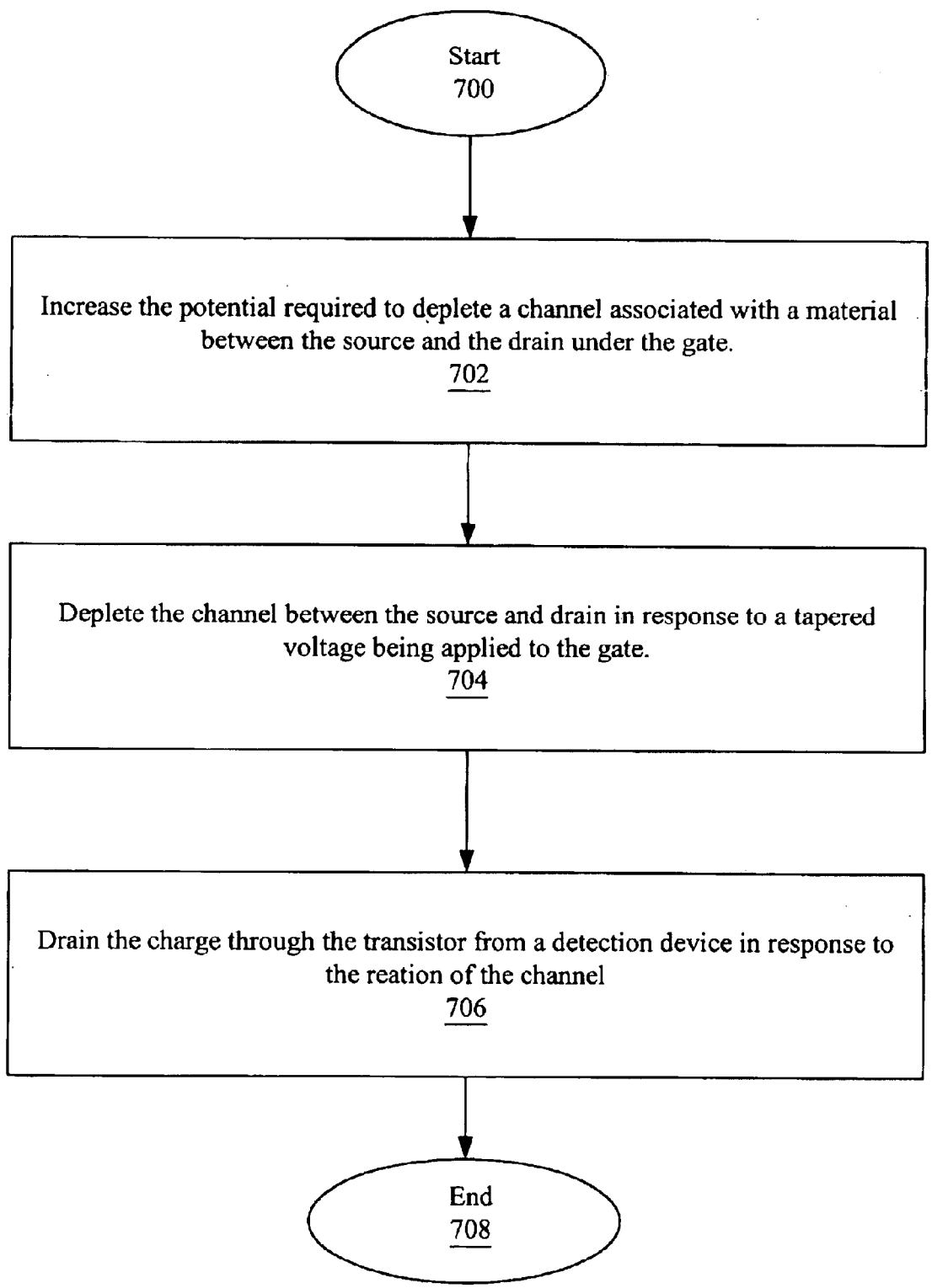
FIG. 7 is a flow diagram illustrating example process for resetting the sensor of FIG. 2.

FIG. 7 is a flow diagram of another example process for resetting the sensor 100 is shown. The process begins 700 with the potential required to deplete a channel associated with a material between the source 204 (FIG. 2), and the drain 110 under the gate 108 being increased 702. A Boron implant 208 (FIG. 2), is added to half of the reset channel that is nearest the photo-detector 210 during fabrication. The implant raises the surface threshold for creation of a depletion region in the transistor by approximately 0.8 volts or higher. A tapered voltage of FIG. 6 is applied to the gate 108 causing a channel to be created 704 under the implant 208. While the channel exist under the implant 208, a path exist for a charge to flow from the photo detection device, such as a photo-detector 102 or photodiode, to the source 204 and eventually to the reset voltage sink 114 (FIG. 1). Thus, the channel drains the charge 706 from the photo-detector 102 to the p-well 204 of the source 106. Upon removal of the voltage at the gate 202 the channel between the source and drain is interrupted and the process is finished 208.

While various embodiments of the invention have been described, it will be apparent to those of ordinary skill in the art that many more embodiments and implementations are possible that are within the scope of this invention.

What is claimed is:

1. A sensor having a transistor with a gate located partially over a source and partially over a drain, comprising:
   a well region formed beneath the source such that a portion of the well region extends partially beneath the gate, the well region having a first conductivity type;
   a material disposed between the well region and the drain beneath the gate, the material having a predetermined length;

an implant in the material, the implant having said first conductivity type; and a detection device coupled to the drain by a signal path, wherein the material allows the detection device to be reset to a predetermined state.

2. The sensor of claim 1, wherein the implant in the material increases a surface threshold of the transistor.

3. The sensor of claim 2, wherein the surface threshold of the transistor is increased to at least 0.8 volts.

4. The sensor of claim 3, wherein the implant has a dopant concentration that is less than the well region.

5. The sensor of claim 2, wherein the implant is formed to extend between the well region and the drain.

6. The sensor of claim 2, wherein the implant is a shallow boron implant.

7. The sensor of claim 2, wherein the predetermined length of the material is at least 20 percent greater than a process minimum.

8. The sensor of claim 2, wherein the drain is formed by a phosphorus implant level between $3e^{13}$ cm$^{-3}$ and about $6e^{12}$ cm$^{-3}$.

9. The sensor of claim 1, wherein the gate is divided into a p-type region and a n-type region.

10. The sensor of claim 9, wherein the gate has a predetermined length that is approximately two times a process minimum.

11. The sensor of claim 9, wherein the material is a p-type material.

12. The sensor of claim 11, wherein the material corresponds to a portion of a p-type substrate that is in proximity to the p-type region of the gate and the portion of the well region extends beneath the n-type region of the gate.

13. The sensor of claim 9, wherein the drain is formed by a phosphorus implant level of approximately $2e^{12}$ cm$^{-3}$.

14. The sensor of claim 9, including an implant region located in the drain extending under the p-type region of the gate such that the drain is not in direct contact with the gate.

15. The sensor of claim 14, wherein the implant region is a surface boron implant region.

16. The sensor of claim 1, wherein the detection device is a photo-detector.

17. The sensor of claim 16, wherein the photo-detector is a photodiode.

18. A sensor having a transistor with a gate located partially over a source and partially over a drain formed in a substrate, comprising:

a well region formed to contain the source such that a portion of the well region extends partially beneath the gate, the well region having a first conductivity type;

an implant formed in the substrate to extend between the well region and the drain such that the implant increases a surface threshold of the transistor, the implant having said first conductivity type; and a detection device coupled to the drain by a signal path, wherein the implant allows the detection device to be reset to a predetermined state when a voltage that is greater than or equal to the surface threshold of the transistor is present on the gate.

19. The sensor of claim 18, wherein the surface threshold of the transistor is increased to at least 0.8 volts.

20. The sensor of claim 18, wherein the gate has a predetermined length and the implant extends approximately a half of the predetermined length of the gate.

21. The sensor of claim 20, wherein the predetermined length of the gate is at least 20 percent greater than a process minimum.

22. The sensor of claim 20, wherein the predetermined length of the gate is approximately two times a process minimum.

23. A sensor, comprising:

a transistor having a source, a drain, and a gate located partially over the source and partially over the drain, the gate having a p-type region and a n-type region;

a well region formed to contain the source and to extend partially beneath the gate such that the well region extends a length of one of the n-type and the p-type gate regions; and a detection device coupled to the drain by a signal path.

24. The sensor of claim 23, wherein the gate has a predetermined length that is approximately two times a process minimum.

25. The sensor of claim 23, wherein the well region is a p-type material and the well region extends the length of the n-type gate region.

26. The sensor of claim 25, further comprising an implant region located in the drain extending under the p-type region of the gate such that the drain is not in direct contact with the gate.

27. A sensor, comprising:

a transistor having a source, a drain, and a gate located partially over the source and partially over the drain, the gate having a p-type gate region and an n-type gate region;

a well region formed to contain the source and to extend partially beneath the gate, wherein the well region is a p-type material and the well region extends a length of the n-type gate region; and a detection device coupled to the drain by a signal path.

28. The sensor of claim 27, further comprising an implant region located in the drain extending under the p-type region of the gate such that the drain is not in direct contact with the gate.

* * * * *